(12) United States Patent
Yoshida

(10) Patent No.: US 6,985,209 B2
(45) Date of Patent: Jan. 10, 2006

(54) POSITION DETECTING METHOD, POSITION DETECTING APPARATUS, EXPOSURE METHOD, EXPOSURE APPARATUS, MAKING METHOD THEREOF, AND DEVICE AND DEVICE MANUFACTURING METHOD

(75) Inventor: Koji Yoshida, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/695,829

(22) Filed: Oct. 30, 2003

(65) Prior Publication Data

US 2004/0090607 A1     May 13, 2004

Related U.S. Application Data

(63) Continuation of application No. 09/719,178, filed as application No. PCT/JP99/03145 on Jun. 14, 1999, now abandoned.

(30) Foreign Application Priority Data

Jun. 15, 1998   (JP) ................................. 10-183311

(51) Int. Cl.
  G03B 27/52        (2006.01)
  G03B 27/42        (2006.01)
(52) U.S. Cl. .......................................... 355/55; 355/53
(58) Field of Classification Search ............... 355/52, 355/53, 55, 67, 77; 356/399–401; 250/548; 430/22, 30, 311
See application file for complete search history.

(56) References Cited

U.S. PATENT DOCUMENTS

| | | | | |
|---|---|---|---|---|
| 4,711,567 A | * | 12/1987 | Tanimoto | ...................... 355/53 |
| 5,162,656 A | * | 11/1992 | Matsugu et al. | ............ 250/548 |
| 5,440,394 A | * | 8/1995 | Nose et al. | ................. 356/636 |
| 5,525,808 A | | 6/1996 | Irie et al. | |
| 5,682,242 A | | 10/1997 | Eylon | |
| 6,002,487 A | | 12/1999 | Shirata | |
| 6,141,107 A | | 10/2000 | Nishi et al. | |
| 6,225,012 B1 | * | 5/2001 | Nishi et al. | ................... 430/22 |
| 6,278,957 B1 | * | 8/2001 | Yasuda et al. | .............. 702/150 |
| 2001/0016293 A1 | | 8/2001 | Nishi et al. | |

FOREIGN PATENT DOCUMENTS

| | | |
|---|---|---|
| JP | 60-245134 | 12/1985 |
| JP | 9-36202 | 2/1997 |
| JP | 9-036202 | 2/1997 |
| JP | 62-124751 | 6/1997 |

* cited by examiner

Primary Examiner—Henry Hung Nguyen
(74) Attorney, Agent, or Firm—Oblon, Spivak, McClelland, Maier & Neustadt, P.C.

(57) ABSTRACT

In order to find the positional relation between the reference coordinate system XY which defines the movement of a substrate W and the arrangement coordinate system $\alpha\beta$ which corresponds to a plurality of divided areas on the substrate W divided by street lines $S\alpha$ and $S\beta$, the substrate W and an observation field are moved relatively. By allowing position detecting method marks Mk on the substrate W to visit the observation field, the street lines $S\alpha$ and $S\beta$ are detected in the observation field during the observation field. According to the results of the detection, an approximate arrangement coordinate system is corrected. The positional relation between the reference coordinate system XY and the arrangement coordinate system $\alpha\beta$ is caught with high accuracy enough to allow the observation field to visit the position detection mark (Mk). Thus, by obtaining the arrangement coordinate system of the divided area in high speed with high accuracy, the highly precise exposure might be performed with improved throughput.

25 Claims, 9 Drawing Sheets

POSITION DETECTING METHOD, POSITION DETECTING APPARATUS, EXPOSURE METHOD, EXPOSURE APPARATUS, MAKING METHOD THEREOF, AND DEVICE AND DEVICE MANUFACTURING METHOD

TECHNICAL FIELD

The present invention relates to a position detecting method, position detecting apparatus, an exposure method, exposure apparatus, and a making method thereof, as well as a device and device manufacturing method. More particularly, the present invention relates to a position detecting method to detect a position of a plural divided areas which are formed on a substrate; an apparatus on which the position detecting method in applied; an exposure used when semiconductor devices are manufactured in lithographic process, in the method, exposure is conducted found on the result obtained by using the position detecting method; an exposure apparatus on which the exposure method is applied, and a making method thereof; as well as a device which is manufactured by using the exposure apparatus and a manufacturing method thereof.

BACKGROUND ART

Conventionally, in a lithographic process for manufacturing a semiconductor device, liquid crystal display device and so forth, an exposure apparatus has been used. In such an exposure apparatus, patterns formed on a mask or reticle (to be genetically referred to as a "reticle" hereinafter) are transferred through a projection optical system onto a substrate such as a wafer or glass plate (to be referred to as a "substrate or wafer" herein after, as needed) coated with a resist or the like.

In general, the semiconductor device is manufactured by using the exposure apparatus, and it is composed of a plurality of circuit pattern layers on a wafer. Therefore, the positioning of the shot area on the wafer and the reticle (to be referred to as "alignment" hereinafter) must be precisely performed when they are overlaid in the exposure apparatus. In order to position them in the apparatus precisely, the position of the wafer must be detected correctly, and the techniques, for example, disclosed in the publication of Japanese unexamined patent application (refer to as "Japan laid-open", hereinafter) No. H9-92591, have been proposed.

In such conventional position detecting methods, enhanced global alignment (to be referred to as "EGA" hereinafter) is widely employed. In EGA, fine alignment marks, which are positioning marks transferred together with circuit patterns on the wafer, are measured at a plurality of positions within the wafer, in order to precisely detect positional relations of the reference coordinate system and the arrangement coordinate system (to be referred to as "wafer coordinate system" hereinafter). Wherein, the reference coordinate system defines the movement of the wafer, and the arrangement coordinate system defines the arrangement of the respective shot areas on the wafer. The arrangement coordinate of the respective shot areas are then obtained by the least-squares approximation or the like, and stepping is performed by using the calculated result in accordance with the accuracy of the wafer stage on exposure. EGA is disclosed in, for example, Japan laid-open No. S61-44429 and its corresponding U.S. Pat. No. 4,780,617. In order to use such EGA, the fine alignment mark formed on the predetermined position on the wafer is observed by high magnifying power. However, the observation field is essentially narrow under the observation with high magnifying power. Therefore, prior to perform fine alignment, the following detection for the reference coordinate system and the arrangement coordinate system is preformed to catch fine alignment marks certainly within the narrow observation field.

At first, the outer edge of the wafer, an object in the positioning detection, is observed. The positional relation between the reference coordinate system and the arrangement coordinate system are detected in the predetermined accuracy derived from the position of the notch in the outer edge, the position of the orientation flat or the outer edge of the wafer. This detection procedure is referred to as "rough alignment".

Then, the observation apparatus is moved to the wafer or vice versa, that is, relative movement of the observation apparatus and the wafer according to the positional relations of the first approximation arrangement coordinate system obtained by rough alignment and the reference coordinate system. A plurality of search alignment marks is caught within the relatively wider observation field, and the search alignment marks are observed. Based on the search alignment marks observed as mentioned above, the positional relation between the reference coordinate system and the arrangement coordinate system is detected in higher accuracy than that obtained in the rough alignment. Such detection procedure is referred to as "search alignment" hereinafter. The observation field of the observation unit is set in an enough range to catch the search alignment mark when the inaccuracy is included in the positional relation between the reference coordinate system and the arrangement coordinate system detected in the rough alignment. Further, the accuracy for the detection of the positional relation between the reference coordinate system and the arrangement coordinate system is set in an enough range for the fine alignment performed in next.

As mentioned above, the rough alignment and the search alignment are sequentially performed. Then, the wafer is moved against the observation unit or vise versa, according to the positional relation between the reference coordinate system and the second-approximated arrangement coordinate system, which is obtained in the search alignment. After that, a plurality of fine alignment marks on the wafer is caught in a narrow observation field to perform fine alignment.

In conventional position detecting methods, three alignments such as rough alignment, search alignment and fine alignment are sequentially conducted. Among them, both in the search alignment and rough alignment, the positions of a plurality of marks to be observed must be detected after they are caught in the observation field, wherein the wafer is moved to the observation unit or vise versa. Therefore, it takes much time to detect the positions of the shot areas by using the conventional method.

On the other hand, in the exposure apparatus, high through put is needed because this apparatus is employed for mass production of semiconductor devices. Therefore, the alignment procedure composed of three steps as mentioned above becomes a problem on the way to accomplish the high through put. Accordingly, it is expected that the new technology to shorten the alignment time, maintaining the present accuracy of the alignment.

The present invention has been made in consideration of the above-mentioned situation. The first object of the present invention is to provide the position detecting method and a position detecting apparatus to conduct the position detection with high accuracy in a short time.

The second object of the present invention is to provide the exposure method and the exposure apparatus with high accuracy and high through put depending on the rapid and precise position detection.

The third object of the present invention is to provide the device on which fine patterns are precisely formed.

DISCLOSURE OF INVENTION

In the first aspect of the present invention, the present invention is a position detecting method for detecting a position of a plurality of divided area formed on the substrate, comprising: moving a substrate to an observation field relatively; detecting a positional relation between a reference coordinate system which defines said movement of a substrate and an arrangement coordinate system corresponding to said plurality of a divided area while the relative movement is performing.

According to the position detecting method, the equal position detection performed in the search alignment may be conducted during the period necessary for fine alignment, in which the substrate and the observation field are relatively moved. Conventionally, this period has been not used for the measurement for alignment. Therefore, the conventional search alignment step may be skipped, and the positional relation between the reference coordinate system and the arrangement coordinate system is detected rapidly.

In the first position detecting method of the present invention, the divided area on the substrate is divided by street lines, and the positional relation is detected based on a detection result of the street line while the relative movement is performing. In this case, the street line is detected within the observation field, moving the substrate and the observation field relatively, when the two coordinates systems are detected. One of the coordinate system is the reference coordinate system for defining the movement of the substrate and the other is the arrangement coordinate system corresponding to the arrangement of a plurality of the divided areas divided by the street lines on the substrate. The street line formed on the substrate is substantially parallel to the coordinate axis of the arrangement coordinate system. That is, the relation between the relative movement direction of the substrate to the observation field and the direction along the axis of the arrangement coordinate may be obtained by detecting the street line in the observation field. The relative movement direction is decided in the reference coordinate system. Furthermore, the street line is detected in the observation field, moving the substrate to the observation field or vice versa, i.e., relative movement. As a result, the relation between the direction of the street line is formed and that of the relative movement is detected accurately, because the detection is not performed based on the street line having short length caught at the moment in the observation field, but that having enough length caught there. Accordingly, the positional relation between the reference coordinate system and the arrangement coordinate system may be detected in high speed, holding its accuracy.

The street lines divide an area to form divided areas on the substrate. In its extension direction, there are usually two directions being perpendicular each other to divide the divided area into matrices. Accordingly, when the direction of the substrate is not decided prior to the detection of the street line, even though one street line is detected, it is not determine that the street line is extended which direction described above for the arrangement of the divided area.

Considering these, in the first position detecting method of the present invention, prior to the detection of the street line, an outer edge of the substrate is measured to obtain a result, and a positional relation between the reference coordinate system and the arrangement coordinate system is detected by using the result with a predetermined accuracy, which is lower than that detected while the substrate is moving to an observation field relatively.

In this case, the outer edge of the substrate is measured to determine uniquely the relation between the arrangement direction of the divided area and the extension direction of the street line, which is caught in the observation field, by using the result. For example, when the divided areas are arranged in matrices and the extension directions of two street lines are perpendicular each other, the rotation direction is obtained less than 45° found on the measurement of the outer edge of the substrate. Accordingly, when one street line is detected, it is recognized that the street line is extended to which array direction in the divided area on the substrate.

When the positional detection is detected with the predetermined accuracy, the substrate may be rotated so that a direction along an axis of the reference coordinate system is substantially parallel with the direction along an axis of the arrangement coordinate system based on the positional relation detected with the predetermined accuracy. This rotation is performed according to the positional relation detected with the predetermined accuracy based on the measurement result of the outer shape of the substrate. In this case, in performing the relative movement of the substrate and the observation field in below, since the relative movement direction may be set as the one of the axis direction of the reference coordinate system, the relative movement is controlled easily.

Further, in the first position detecting method of the present invention, the observation field is moving to the substrate relatively along the street line. In this case, since the particular street line is continuously detecting, the accuracy in the position detection between the reference coordinate system and the arrangement coordinate system derived from the detection of the street line may be improved.

In the detection of the street line, a positional change of a border between the divided area and the street line is measured by observing of a moving picture in the range of the observation field to obtain a result, while the relative movement is performed, and the positional relation is detected based on a measurement result of the change of the border. In this case, the positional change between the border of the divided area and the street line is measured by observing the moving picture in the observation field while the substrate and the observation field are moving relatively. Accordingly, the positional relation between the reference coordinate system and the arrangement coordinate system is detected in high accuracy and high speed. At that time, the relative movement of the substrate and the observation field is not discontinued, and the image-pick up apparatus having high-speed shutter, of which speed is enough high compared to that of the relative movement, is not needed, conducting the image pick-up in the observation field.

When it is presumed that the border is out of the range of the observation field, the relative movement of the substrate to the observation field may be corrected so that the border in the range of the observation field is continuously caught. According to the described above, since the border is continuously caught in the observation field, and it is assured to observe the border between the divided area and the street line extending over the enough length of the street line. Therefore, the relation between the direction of the street line is formed and that of the relative movement is detected reliably in high accuracy.

Since the substrate and the observation field is relatively moved when the street line is detected, the images obtained as the image picked-up result generally become blur images. When the object moves to the camera (i.e., the observation field) during pick-up time, if the time for picking up image is not enough short against the velocity of the relative movement (i.e., the shutter speed is enough high). Then, the blur image is formed by the overlapped images caught at each moment. That is, the blur image is formed by the total amount of the light which reached each points in the observation field during the predetermined pick-up time. However, even though generating such blur image, the moving velocity of the border between the divided area and the street line becomes enough slow in the observation field, when the observation field is moved relatively along the street line. The moving direction of the border is perpendicular to that of the relative movement in the observation field. On the contrary, in the area corresponding to the divided area, the blur image having the brightness corresponding to mean reflectance of the divided area is formed. In the area corresponding to the street line, the image having the brightness corresponding to mean reflectance of the street line is formed. In general, the mean reflectance in the divided area is different from that in the street line.

In detection of the street line, an image formed by the total amount of the light which reached respective point in the range of the observation field during predetermined time is picked-up; and the positional change of the border in the range of the observation field is measured based on the image pick-up result. In this case, the positional change of the border between the divided area and the street line in the observation field, i.e., the positional relation between the reference coordinate system and the arrangement coordinate system, may be detected by using the image pick-up result, the blur image, positively. For example, in the above-mentioned case, the border between the divided area and the street line is detected by detecting the turning point of the brightness in the obtained image. Then, the positional relation between the reference coordinate system and the arrangement coordinate system is detected based on the detection result. Accordingly, the positional relation between the reference coordinate system and the arrangement coordinate system is detected accurately, when the relative movement velocity of the substrate and the observation field is fast. As a result, the image pick-up apparatus of which image pick-up time is relatively long and is commercially available may be used.

In the first position detection method of the present invention, the relative movement of the substrate to the observation field is performed to catch a predetermined number of position detection mark, which is chosen from a plurality of the position detection mark formed on the street line, in the observation field with predetermined order; the position of the chosen position detection mark is detected; based on the detection result, the positional relation may be detected with higher accuracy than that detected during the relative movement.

With this, the street line is detected while the predetermined number of the position detection marks formed on the street line, i.e., fine alignment marks, are moved in the observation field. Then, according to the detection result, the positional relation between the reference coordinate system and the arrangement coordinate system is detected in the predetermined accuracy. The substrate and the observation field moves relatively along the street line. The target position for movement of the position detection mark for the position detection mark to be visited is corrected by using the detected positional detection, during this relative movement of the substrate and the observation field. Correcting the target position as mentioned above, based on the corrected target position, the position detection marks are sequentially detected by moving the substrate and the observation field relatively. After detecting the predetermined number of the position detection marks, based on such position detection results, the positional relation between the reference coordinate system and the arrangement coordinate system are detected in high accuracy by using, for example, EGA method. Accordingly, in the present invention, since fine alignment is performed without conducting the conventional search alignment, the positional relation between the reference coordinate system and the arrangement coordinate system are detected rapidly, keeping with its high accuracy.

In the second aspects of the present invention, the present invention is the second position detecting method for detecting position of a plurality of divided areas which are divided by street lines on a substrate by detecting a plurality of position detection mark formed on said street line, wherein the street line is detected when said plurality of position detection mark is sequentially detected, and a moving route of said substrate is decided by using a detection result.

According to this, the street line is detected while the observation field moves to a plurality of the position detection marks formed on the street line, i.e., fine alignment marks. According to the detection result, the positional relation between the reference coordinate system and the arrangement coordinate system is detected in the predetermined accuracy. By using the detected positional relation, the target position for the position detection mark to be detected is corrected during this relative movement of the substrate and the observation field. Thus correcting the target position for movement, the position detection marks are sequentially detected based on the corrected target position as mentioned above. Then, after detecting the predetermined number of the position detection marks, the positional relation between the reference coordinate system and the arrangement coordinate system is detected based on the detection result in high accuracy by using, for example, the EGA method. Accordingly, since fine alignment is performed without conducting the conventional search alignment, the positional relation between the reference coordinate system and the arrangement coordinate system are detected rapidly, keeping with its high accuracy.

Also in the second position detecting method of the present invention, similarly to the first position detecting method, prior to the detection of the street line, an outer edge of the substrate is measured and a positional relation between the reference coordinate system and the arrangement coordinate system may be detected by using the result. In this case, when one street line is detected, it is recognized that the street line is extended to which array direction of the divided area on the substrate.

Furthermore, similarly to the case of the first position detecting method, by using the positional detection obtained from the measurement result of the outer edge of the substrate, the substrate may be rotated so that a direction along an axis of the reference coordinate system is substantially parallel with the direction along an axis of the arrangement coordinate system. In this case, the same effects that brought by the first position detecting method of the present invention is brought.

In the second position detecting method of the present invention, similarly to the first position detection method, the observation field may be moved against the substrate relatively along the street line. In this case, similarly to the first position detection method, since the particular street line is continuously detected, the accuracy of the detection in the positional detection between the reference coordinate system and the arrangement coordinate system derived from the detection of the street line may be improved.

In the detection of the street line, a positional change of the border between the divided area and the street line in the observation field may be measured by observing a moving picture in the range of the field, while moving the substrate to the observation field relatively. In this case, the positional change of the border between the divided area and the street line in the field is measured by observing the moving picture in the field during the relative movement of the substrate and the observation field. Accordingly, the positional relation between the reference coordinate system and the arrangement coordinate system may be detected in high accuracy and high speed, when the image in the observation field is picked up. At that time, the relative movement is not discontinued, or the image pick-up apparatus having high-speed shutter, of which speed is enough high compared to that of the relative movement is not used.

Furthermore, similarly to the first position detecting method, when it is presumed that the border is out of the observation field, the relative movement of the substrate and the observation field may be corrected so as to catch continuously the border in the range of the observation field. In the detection of the street line, the image formed by the total amount of the light reached respective point in the observation field during predetermined time is picked-up. Then, the positional change of the border in the field may be measured by using the picked up image result. In this case, the same effect that brought by the first position detecting method is brought.

In the third aspect of the present invention, the present invention is a position detecting apparatus for detecting a plurality of divided area on a substrate comprising: a position of a substrate stage which holds said substrate; a driving unit which drives said substrate stage; and an observation system which observes said substrate while said substrate is moved by said driving unit.

According to this, the substrate may be observed by the observation system while the substrate held by the substrate stage is moving. Therefore, the position detecting method is performed by the apparatus and the positional relation between the reference coordinate system and the arrangement coordinate system may be detected in high speed.

In the position detecting apparatus of the present invention, this apparatus may further comprise a control system for controlling the driving unit to detect the street line, which divides the area on the substrate into the divided area, by using the observation system, moving said substrate stage, when the position detection marks on the substrate are detected. In this case, the control system moves the substrate stage through the driving unit so as to detect the street line in the observation field, when the substrate is observed. Accordingly, the positional relation between the reference coordinate system and the arrangement coordinate system may be detected accurately in high speed.

In the position detecting apparatus of the present invention, the control system may be the structure wherein the driving unit is controlled by the control unit so as to trace the route to the predetermined position detection mark which are chosen among the position detection marks formed on the street line by the observation field; the position of the predetermined position detection marks chosen are detected, and the position of the divided area is respectively detected by using the detection result of the predetermined detection mark.

With this, the control system moves the substrate stage to sequentially catch the predetermined number of the position detection marks formed on the street line, i.e., fine alignment marks, in the observation field of the observation system. During the movement of the substrate stage, the observation system detects the street line. The control system detects the positional relation between the reference coordinate system and the arrangement coordinate system by using the detection result in the predetermined accuracy, and the target position for movement for the position detection mark to be detected is corrected, while the substrate stage is moving. The control system thus corrects the target position for the movement, and the substrate stage is moved based on the target position for the movement, and then the position detection mark is sequentially detected. The control system detects the positional relation between the reference coordinate system and the arrangement coordinate system, according to detection result of the predetermined number of the position detection marks, by using, for example, EGA method, in high accuracy. According to the detection result, the positional relation between the reference coordinate system and the arrangement coordinate system is detected in the predetermined accuracy. Accordingly, in the present invention, since fine alignment is performed without conducting the conventional search alignment, the positional relation between the reference coordinate system and the arrangement coordinate system are detected rapidly, keeping with its high accuracy. The route may be along the street line.

The forth aspect of the present invention, the present invention is the exposing method wherein a predetermined pattern is transferred to a divided area on a substrate by emitting an energy beam comprising, prior to the transfer, detecting a position of said divided area formed on the substrate by using the position detecting method of the present invention. According to this, the position of the divided area formed on the substrate may be accurately detected by using the position detecting method of the present invention in high speed; then, the predetermined patterns are transferred to the substrate by exposing second layer and subsequent layers for the divided area. Accordingly, multilayer exposure is conducted to form multilayer patterns, holding the overlay accuracy in enhanced through put.

In the fifth aspect of the present invention, the present invention is the exposure apparatus for transferring the predetermined pattern to the divided area on the substrate by emitting energy beam comprising: an illumination system for emitting the energy beam; and the position detection apparatus of the present invention for detecting the position of the divided area. With this, the predetermined pattern is transferred onto the divided area after high speed and high accuracy position detection is performed by detecting the position of the divided area formed on the substrate with the position detecting apparatus of the present invention. Therefore, the multilayer exposure may be conducted to form multilayer patterns, holding the overlay accuracy among layers in enhanced through put.

In the sixth aspect of the present invention, the present invention is the making method for an exposure apparatus wherein the predetermined pattern is transferred to the predetermined divided area on a substrate by emitting energy beam comprising: providing the illumination system for emitting the energy beam; providing the substrate stage for holding the substrate; providing the driving unit for driving the substrate stage; providing a observation system for observing the substrate during movement the substrate stage by the driving unit. According to this, the illumination system, position detecting apparatus, and other various parts and devices are connected and assembled mechanically, optically and electrically, and adjusted, thereby the exposure apparatus for transferring the pattern onto the substrate may be produced.

The making method for the exposure apparatus of the present invention may further comprise providing the control system for controlling the driving unit to detect the street line, which divides the area on the substrate into the divided area, in the observation system, moving the substrate stage, when the mars on the substrates are detected. In this case, the apparatus as follows is made, wherein the control unit moves the substrate stage in the observation field of the observation system through the driving unit, observing the substrate by the observation system.

Furthermore, in the lithography step, the device having fine patterns on it may be manufactured by exposing the substrate with the exposure apparatus of the present invention to transfer the predetermined pattern onto the substrate. Accordingly, the present invention is the device produced by using the exposure apparatus of the present invention in another view point, and also it is the manufacturing method of device by using the exposure method of the present invention to transfer the predetermined pattern onto the substrate.

BEST MODE FOR CARRYING OUT THE INVENTION

An exposure method and exposure apparatus according to an embodiment of the present invention will be described below with reference to FIGS. 1 to 9.

Figure 1:
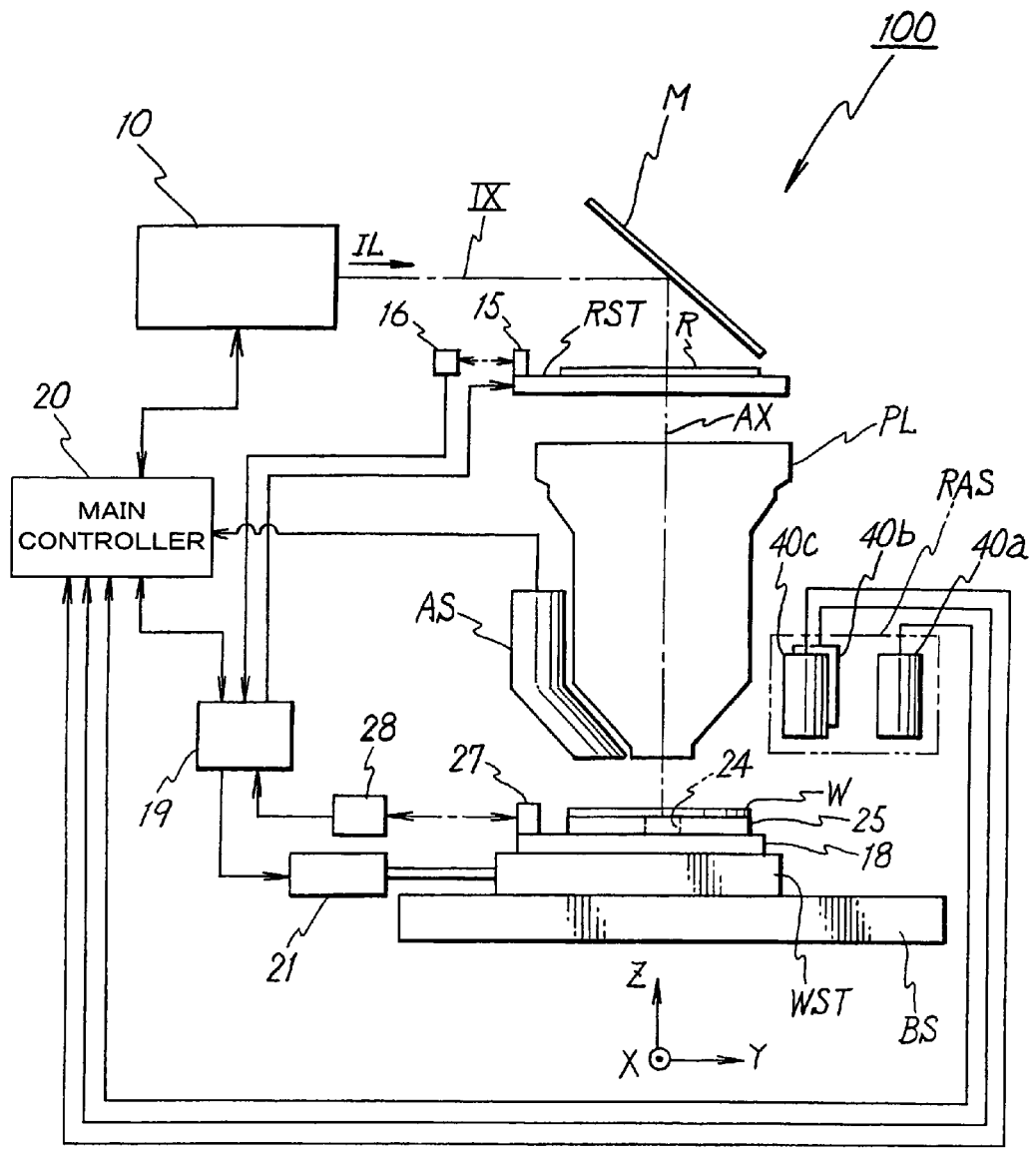
FIG. 1 is a view showing the schematic arrangement of an exposure apparatus according to one embodiment.
Figure 2:
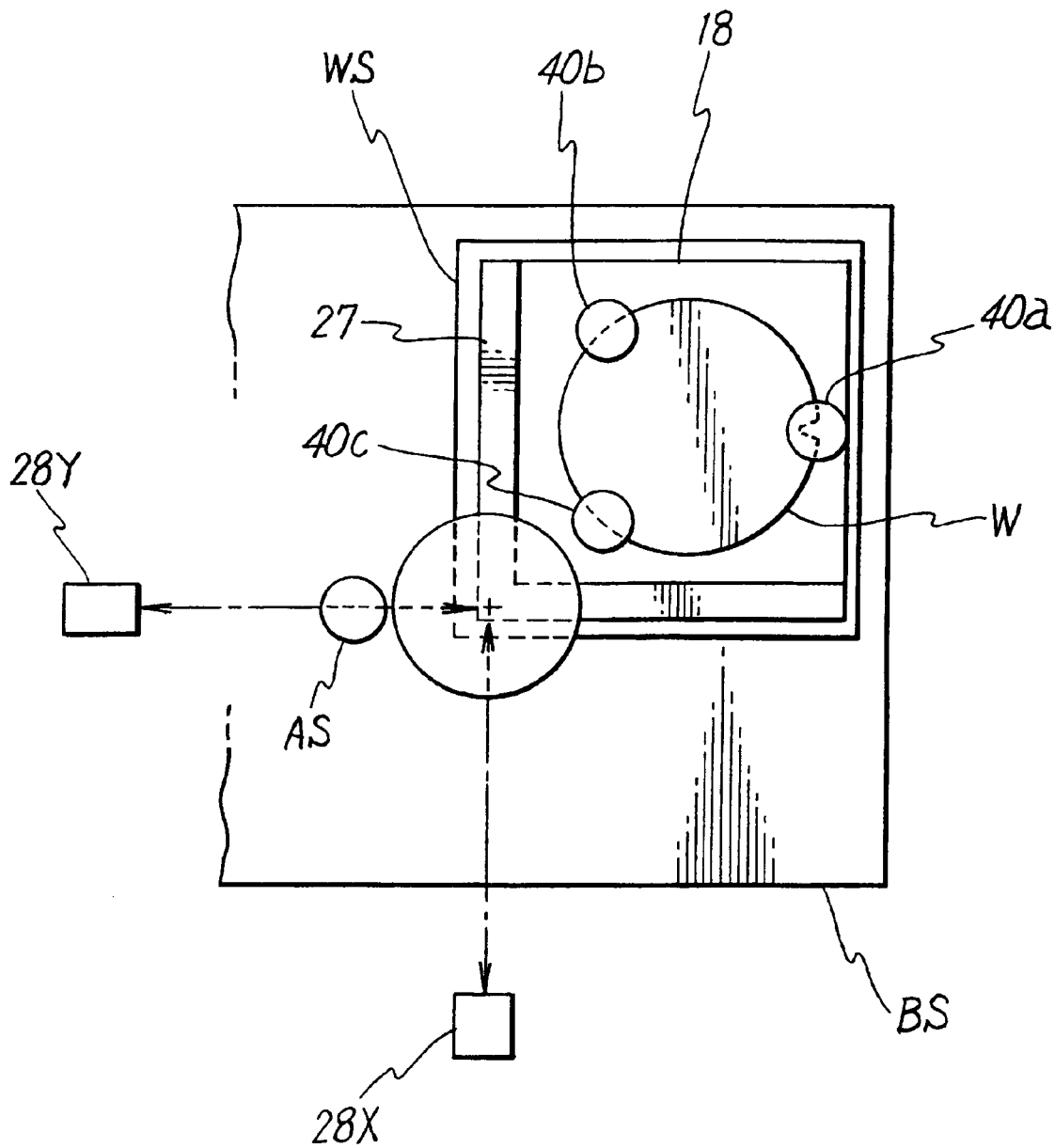
FIG. 2 is a view for explaining the rough alignment detection system of the apparatus in FIG. 1.

FIG. 1 shows the schematic arrangement of an exposure apparatus 100 according to one embodiment of the present invention. The exposure apparatus 100 is a scanning type projection exposure apparatus comprising a position detecting apparatus based on a so-called step-and-scan exposure method.

The exposure apparatus 100 comprises: the illumination system 10 for emitting illumination light for exposing the wafer, reticle stage RST serving as a mask stage for holding the reticle R as a mask; a projection optical system PL; the wafer stage WST for moving two-dimensionally the wafer W as the substrate within the X-Y plane; the rough alignment detecting system RAS for observing outer edge of the wafer W; the alignment detecting system AS as the observing system for observing fine alignment mark as position detecting marks or street lines, and the control system for controlling thereof.

The illumination system 10 includes: the light unit; a shutter, the secondary light source forming optical system, a beam splitter, a condenser lens system, a reticle blind, and an image lens system, which are not shown in FIG. 1. The respective components of the illumination system 10 are disclosed Japan laid-open No. H9-320956. As the light source unit, followings are used: KrF excimer laser beam (wavelength= 248 nm), ArF excimer laser beam (wavelength=193 nm), $F_2$ laser beam (wavelength=157 nm), $Kr_2$ (krypton dimer) laser beam (wavelength=146 nm), $Ar_2$ (argon dimer) laser beam (wavelength=126 nm), high harmonic generation devices such as copper vapor laser or YAG laser harmonics, an ultra-high pressure mercury vapor lamp (e.g., g-line or i-line), or the like. Alternatively, instead of the light, which is emitted from the above-mentioned light source, beam such as charged electron x-ray and electron beam might be used.

Function of the illumination system 10 composed as described above is briefly explained. The light beam, which is emitted from the light source, reaches the secondary light source forming optical system when the shutter is opened, thereby many secondary light sources are formed at the emission terminal of the secondary light source optical system. The illumination light from the secondary light source that passes through both the beam splitter and the condenser lens system, and reach the reticle blind. Then the illumination light passed through the reticle blind is emitted to the mirror M through the image lens system.

The mirror M bends the optical path of the illumination light beam IL vertically down load, and then the light beam illuminates the illumination area IAR portion (see FIG. 3) formed as the rectangular shape on the reticle R, which is held on the reticle stage RST.

The reticle R is fixed on the reticle stage RST, for example, by vacuum chucking. In order to position the reticle R, the reticle stage RST is structured so that it can be finely driven two-dimensionally (in the X-axis direction, the Y-axis direction perpendicular to the X-axis direction, and the rotational direction around the Z-axis perpendicular to the X-Y plane) within a plane perpendicular to an optical axis IX (coinciding with an optical axis AX of the projection optical system PL, which will be described later) of the illumination optical system.

The reticle stage RST can be moved on a reticle base (not shown in FIGS.) in a predetermined scanning direction (Y-axis direction in this case) at a designated scanning velocity by a reticle driving portion (not shown in FIGS.) structured of a linear motor or the like. It has a movement stroke which the entire surface of the reticle R can at least cross the optional axis IX of the illumination optical system.

On the reticle stage RST, a moving mirror 15 for reflecting a laser beam from a reticle laser interferometer (to be referred to as a "reticle interferometer" hereinafter) 16 is fixed. The reticle interferometer 16 detects the position of the reticle stage RST within the stage movement plane at all times by for example, a resolution of about 0.5 to 1 nm. In practice, a moving mirror which has a reflecting surface perpendicular to the scanning direction (Y-axis direction) and a moving mirror which has a reflecting surface perpendicular to the non-scanning direction (X-axis direction) are mounted on the reticle stage RST. Also, the reticle interferometer 16 is arranged on one axis in the scanning direction, and on two axes in the non-scanning direction. However, in FIG. 1, these are represented as the moving mirror 15 and reticle interferometer 16.

Positional information of the reticle stage RST is sent from the reticle interferometer 16 to a stage control system 19 and to the main controller 20 via the stage control system 19. The stage control system 19 drives the reticle stage RST through a reticle driving portion (not shown in FIGS.) by instructions from the main controller 20 based on the positional information of the reticle stage RST.

A reticular alignment system (not shown in FIGS.) determines the initial position of the reticle stage RST so that the reticle R is accurately positioned at a predetermined reference position. Therefore, the position of the reticle r can be measured with a sufficiently by only measuring the position of the moving mirror 15 with the reticle interferometer 16.

The projection optical system PL is arranged below the reticle stage RST in FIG. 1. The direction of the optical axis AX (which coincides with the optical axis IX of the illumination optical system) of the projection optical system PL is the Z-axis direction. In order to make the projection optical system PL double telecentric, a refraction optical system configured of a plurality of lens elements arranged at predetermined intervals along the optical axis AX is employed. The projection optical system PL is a reduction optical system having a predetermined projection magnification of, for example, ⅕, ¼ or ⅙. Therefore, when the illumination area IAR of the reticle R is illuminated with the illumination light IL from the illumination optical system, a reduced image (partial inverted image) of the circuit pattern of the reticle R in the illumination area IAR is formed on the wafer W which surface is coated with a photo-resist.

The wafer stage WST can be in the Y-axis direction that is in the predetermined scanning direction (Y-axis direction is shown as the right or left direction in FIG. 1) or the X-axis direction that is perpendicular to the Y-axis direction (the X-axis direction is shown as the perpendicular to the sheet of FIG. 1), for example, by a two dimensional linear actuator. The substrate table 18 is fixed on the wafer stage WST. The wafer holder 25 is mounted on the substrate table 18. The wafer W as a substrate is held on the wafer holder 25 by vacuum chucking. The substrate stage is composed of the wafer stage WST, the substrate table 18, and the wafer holder 25.

The substrate table 18 is mounted on the wafer stage WST of which position is fixed in X-Y axis direction but allowing to move or tilt Z-axis direction. The substrate table 18 is supported by three shafts, which are not shown in the figures. These three shafts are independently driven by the wafer driving unit 21 in Z-axis direction to establish the face position of the wafer W held on the substrate table 18 (the position in Z-axis direction and the tilt on X-Y plane) in predetermined situation. Furthermore, the wafer holder 25 can rotate along the Z-axis. Accordingly, the wafer holder 25 is driven in 6 degrees of freedom by the two-dimensional linear actuator or the driving unit. However, the two dimensional linear actuator or the driving unit is shown in FIG. 1 as the typical example.

On the substrate table 18, a moving mirror 27 is fixed for reflecting a laser beam from a wafer laser interferometer (to be referred to as a "wafer interferometer" hereinafter) 28. The wafer interferometer 28 arranged externally detects the position of the wafer W in the X-Y plane at all times with a resolution of about 0.5 to 1 nm.

In the practice, a moving mirror which has a reflecting surface perpendicular to the Y-axis direction, that is the scanning direction, and a moving mirror which has a reflecting surface perpendicular to the X-axis direction, that is the non-scanning direction, are on the substrate table 18. The wafer interferometer 28 is arranged on one axis in the scanning direction, and on two axes in the non-scanning direction. However, in FIG. 1, these are represented as the moving mirror 27 and wafer interferometer 28. The positional information (or velocity information) is sent to the stage control of system 19 and to the main controller 20 through the stage control system 19. The main controller 20 instructs the stage control system 19 to control and drive the wafer stage WST via a wafer driving unit 21. A control system is structured of main controller 20 and the stage control system 19.

Alternatively, on the substrate table 18, a reference mark plate as mentioned in below, which is not shown in FIGS., is fixed. The mark plate, on which several kinds of the reference marks are formed, is used to measure the distance from the detection center in the alignment detection system AS to optical axis in the projection optical system PL.

The rough alignment detection system RAS is held at the position distant from the projection optical system PL and upward of it by using the holding member, which is not shown in FIGS. The rough alignment detection system RAS is composed of three rough alignment sensors 40a, 40b, and 40c, all of which detect the position of three points on the outer edge of the wafer W. Wafer W is carried by the wafer loader, not shown in FIGS., and it is held on the wafer holder 25. These three rough alignment sensors 40a, 40b, and 40c are placed at the positions on circumference of a circle which has predetermined radius (this radius is the almost same as that of the wafer) so that the central angle is set to 120 degrees. Among them, the rough alignment sensor 40a is placed at the position, wherein the sensor 40a is capable of detecting a notch N (the notch is a V-shaped cutout) formed on the wafer W held on the wafer holder 25. As the rough alignment sensor, an image processing method sensor composed of an image pick-up device and image processing circuit is used.

Return to FIG. 1, the alignment system AS is arranged at the side of the projection optical system PL. In this embodiment, an off-axis alignment microscope is employed, in which the microscope is composed of an imaging alignment sensor to observe the street lines or marks for position detection (fine alignment marks) formed on the wafer. The detailed structure of this alignment system AS is disclosed in, for example, Japan laid-open No. H9-219354, and its correspondent, U.S. Pat. No. 5,859,707. The disclosure described in the above is fully incorporated by reference herein, as far as the law of the countries designated in a request or elected in a demand for the application filed in the country of origin permits them. The image of the wafer W observed in the alignment system AS is transmitted to the main controller 20.

Figure 3:
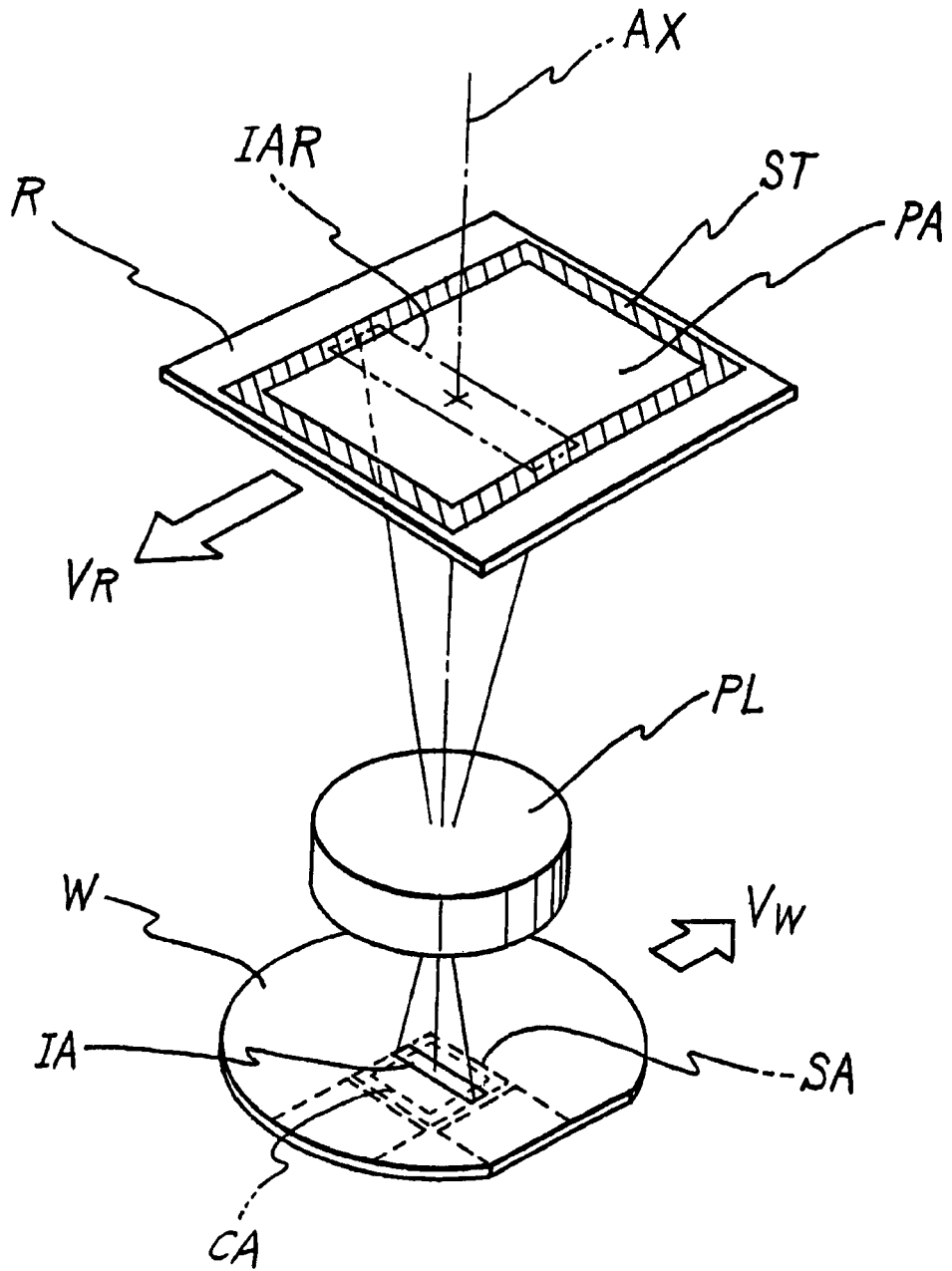
FIG. 3 is a perspective view for explaining the principle of scanning exposure performed by the apparatus in FIG. 1.
Figure 3:
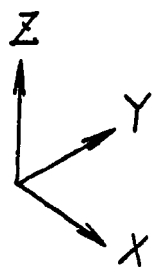

The apparatus in FIG. 1 further includes a multiple focal position detection system for detecting the positions of the range within the exposure area IA (to be referred as "the area on the wafer which conjugates to above-mentioned illumination area IAR": see FIG. 3) on the surface of the wafer W and the area around it in the Z direction (the direction of the optical axis AX). The multiple focal position detection system is one of a focus detection system based on the oblique incident light method. The multiple focal position detection system, not shown in FIGS., is configured of an emitting optical system and a light-receiving optical system. For example, the emitting optical system includes an optical fiber bundle, condenser lens, pattern forming plate, lens, emitting object lens, and the like (none of which are shown). The light-receiving optical system includes a condenser object lens, a rotational direction vibration plate, and image forming lens, a light-receiving slit plate, a light-receiving unit having many photosensors, and the like (none of which are shown). The detailed structure of this multiple focal position detection system is disclosed in, for example, Japan laid-open No. H6-283403 and its corresponding U.S. Pat. No. 5,448,332. The disclosure described above is fully incorporated by reference herein, as far as the law of the countries designated in a request or elected in a demand for the application filed in the country of origin permits them.

The operation principal of the scanning exposure by using the exposure apparatus 100 will be briefly described. With the exposure apparatus 100 of this embodiment, as shown in FIG. 3, the reticle R is illuminated with the rectangular (slit-shaped) illumination area IAR, of which longitudinal direction is perpendicular to the scanning direction of reticle R (Y-axis direction). On exposure, the reticle R is scanned in the −Y direction at a velocity $V_R$. The illumination area IAR (which center almost coincides with the optical axis AX) is projected on the wafer W through the projection optical system PL. As a consequence, a slit-shaped projection area conjugate to the illumination area IAR, i.e., the exposure area IA, is formed. Since the wafer W and reticle R have an inverted image forming relationship, the wafer W is scanned in a direction (+Y direction) opposite to the direction of the velocity $V_R$ at a velocity $V_W$ in synchronism with the reticle R. Thus, the entire surface of a shot area SA on the wafer W can be exposed. The scanning velocity ratio $V_W/V_R$ accurately corresponds to the reduction magnification of the projection optical system PL. The pattern on a pattern area PA of the reticle R is accurately reduced and transferred onto the shot area SA on the wafer W. The semiconductor circuit pattern is formed on the chip area CA as a divided area in the shot area SA. The width of the illumination area IAR in the longitudinal direction is set to be larger than that of the pattern area PA on the reticle R, but smaller than the maximum width of a light-blocking area ST. Therefore, by scanning the reticle R, the entire area of the pattern area PA is illuminated.

The operation of exposure by exposure apparatus 100 will be briefly described.

First of all, in this embodiment, the first layer is exposed. On exposing the first layer, the reticle R on which a pattern for the first layer is formed is loaded onto the reticle stage RST by a reticle loader (not shown in FIGS.). Similarly, the wafer W to be exposed is loaded onto the substrate table 18 by the wafer loader.

Subsequently, the rough alignment for the wafer W loaded onto the substrate table 18 is conducted. In this rough alignment procedure, the main controller 20 moves the substrate table 18 through the stage controller system 19 and stage driving unit 21 to roughly position the wafer. In this positioning, the notch N is located directly below the rough alignment sensor 40a, and edge of the wafer W is located also directly below the rough alignment sensors 40b and 40c.

On this condition, the rough alignment sensor 40a detects the position of the notch N formed at the edge of the wafer W. The rough alignment sensors 40b and 40c detect the position of the edge of the wafer W. These detection results obtained by the sensors are transmitted to the main controller 20. In order to adjust the direction of wafer W by using the detection results provided from the rough alignment sensor 40a, 40b, and 40c, the main controller 20 drives in rotation the wafer holder 25 through the stage control system 19 and the wafer driving unit 21.

Then, exposure for the first layer is performed. In this exposure procedure, first of all, the substrate table 18 is moved to so that the X-Y position of the wafer W becomes the starting position for scanning to expose the first shot area on the wafer W. The main controller 20 moves the substrate table through the stage control system 20 and the wafer driving unit 21. Simultaneously, the reticle stage RST is moved so that the X-Y position of the reticle R becomes the starting positions for scanning. The main controller 20 moves these stages through the stage control system 19, the reticle driving portion (not shown in FIGS.), or the like.

Responding to the instruction from the main controller, the stage control system 19 then performs scanning exposure by moving the reticle stage R and the wafer W relatively through the reticle driving portion, not shown in FIGS., and the wafer driving unit 21. This scanning exposure is performs according to the Z-positional information of the wafer detected by the multiple focal position detecting system, X-Y positional information of the reticle R measured by the reticle interferometer 16, and the wafer positional information measured by the reticle interferometer 31, adjusting the surface position of the wafer W. During scanning exposure, reticle R and the wafer W are relatively moved.

When exposure on the first shot area is thus finished, the substrate table 18 is moved so as to set the starting position for scanning to expose the next shot area. Simultaneously, the reticle stage RST is also moved so that the X-Y position of the reticle R becomes the starting position for scanning. Then, the scanning exposure to the shot area is performed in the same manner as that of the exposure on the first shot area. The scanning exposure for each shot area is similarly performed, and exposure on the first layer is completed.

When exposure on the first layer is completed, the wafer W is removed from the exposure apparatus 100, and the wafer W is developed, and etched. Then, a new film is formed on the wafer W, and the film surface is polished, and photoresist is coated on the film surface. After performing such processes, exposure on the second layer is performed. In order to form a circuit pattern which is accurately overlaid on the pattern previously formed, the positional relation between the the reference coordinate system (X, Y) and the arrangement coordinate system ($\alpha$, $\beta$) is detected precisely, and then exposure is performed, by using the detection result, as mentioned below. The reference coordinate system (X, Y) defines the movement of the wafer W, i.e., the movement of the wafer stage WST. The arrangement coordinate system ($\alpha$, $\beta$) relates to the arrangements of the circuit pattern formed on the wafer W, i.e., the arrangements of the chip areas.

Figure 4:
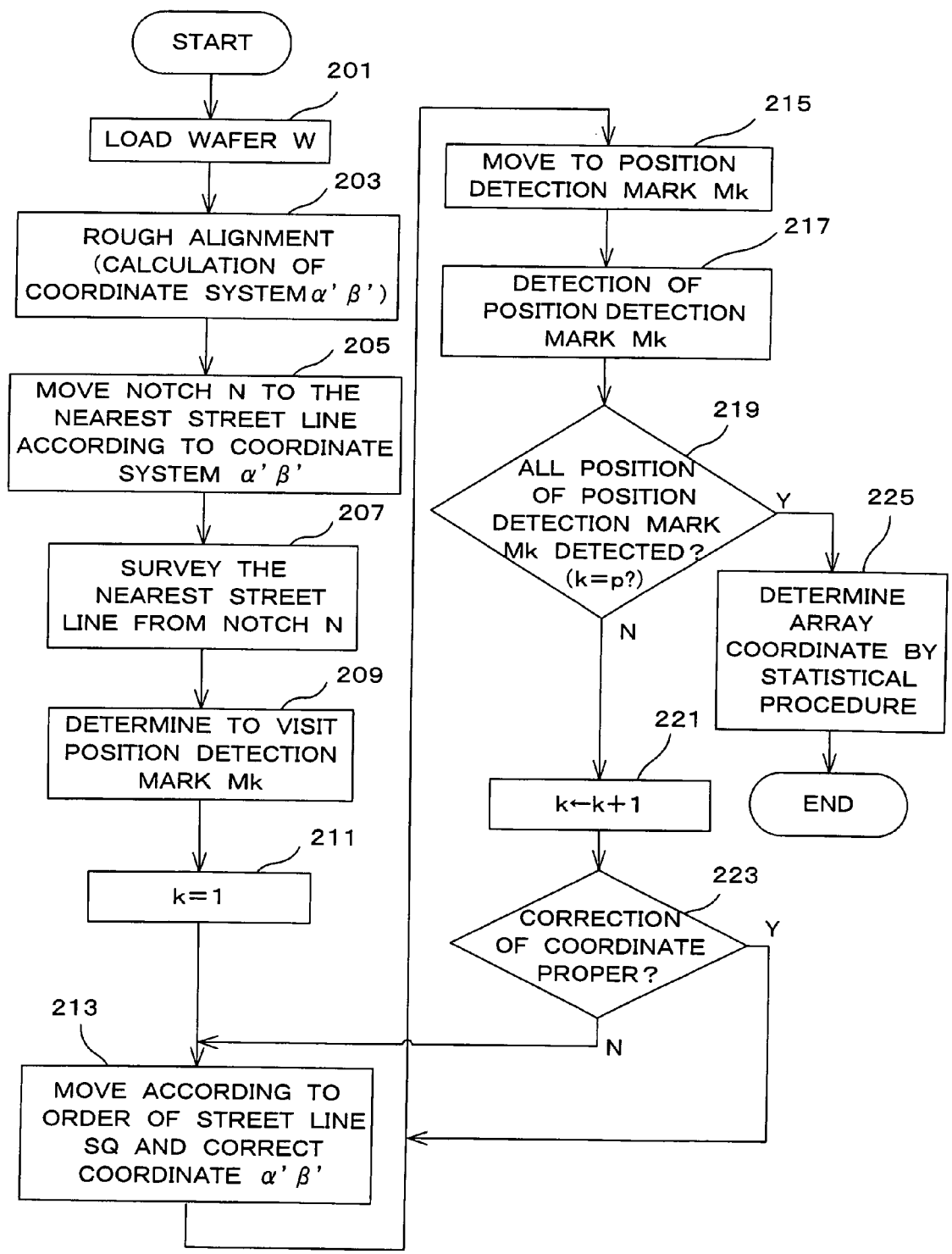
FIG. 4 is a flow chart of an alignment procedure prior to exposure for the second layer and subsequent layers.

The detection of the positional relation between the reference coordinate system (X, Y) and the arrangement coordinate system ($\alpha$, $\beta$) in the embodiment of the present invention will be described below with reference to FIGS. 4 to 7. FIG. 4 is a flowchart showing an example of the detection for the positional relation.

First of all, after the predetermined preparation procedure is finished, the reticle R on which the pattern should be formed on the second layer is loaded onto the reticle stage RST by using the reticle loader. Subsequently, the main controller 20 performs the reticle alignment and the measurement of the base line by using the reticle microscope, the reference mark plate on the substrate table 18, and the alignment system AS, which are not shown in FIGS.

Figure 5:
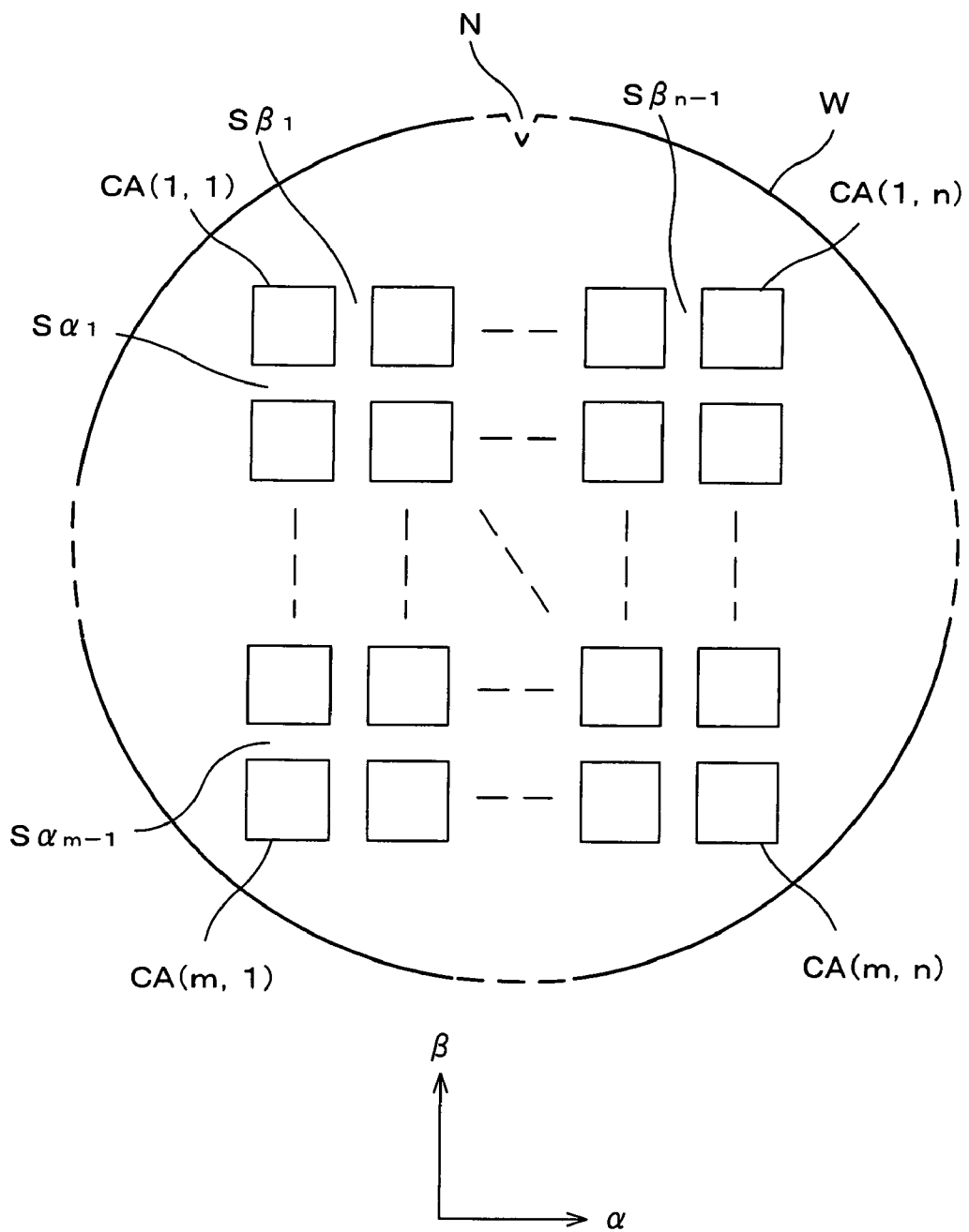
FIG. 5 is a view showing arrangements as an example of chip areas and street lines on the wafer.
Figure 6:
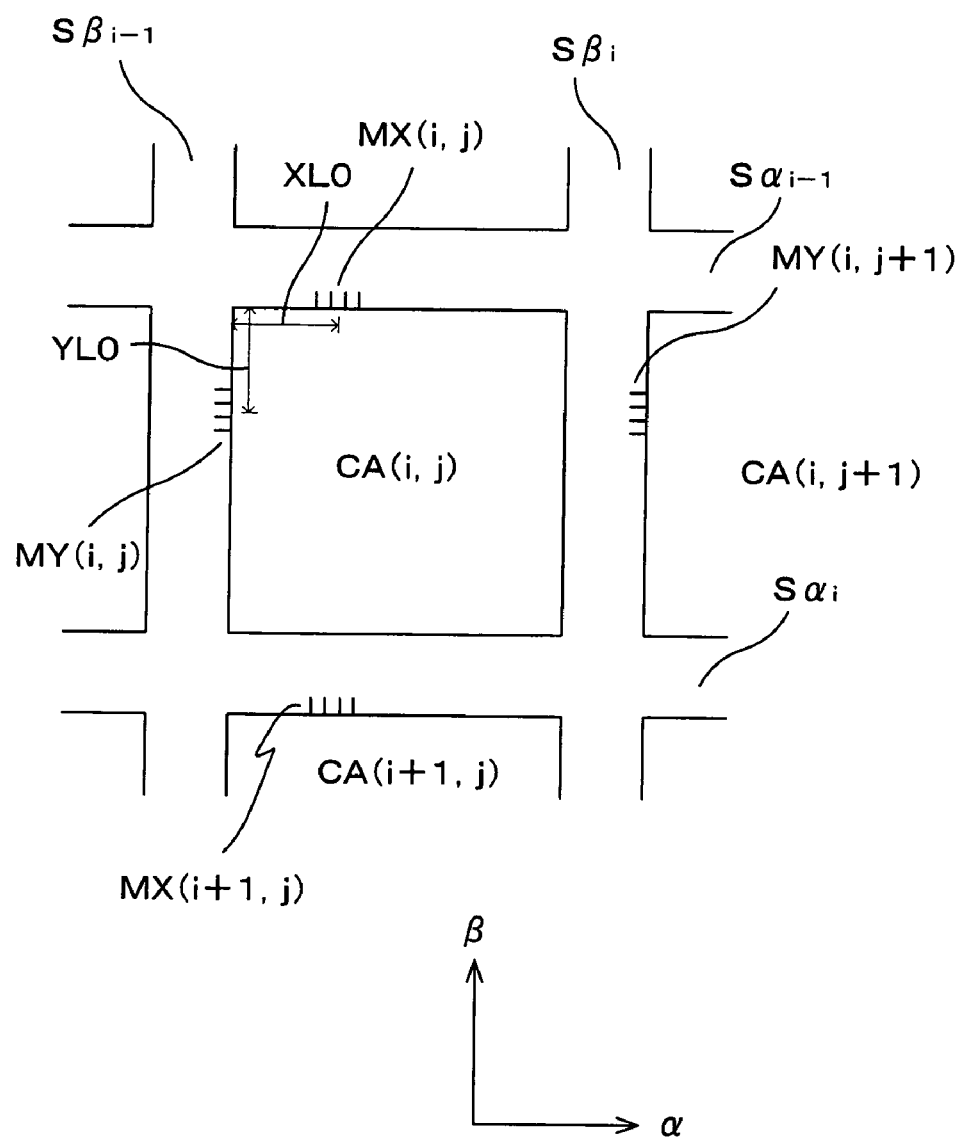
FIG. 6 is a view showing as an example of sites of position detection marks formed.

After this procedure, in step 201 on FIG. 4, the wafer W is loaded on the substrate table 18 by the wafer loader to expose the second layer. As shown in FIG. 5, on the wafer W, the chip area CA (i, j) (i=1 to m−1, j=1 to n) are formed, and they are divided into matrices by the street lines. The street line $S\alpha_i$ (i=1 to m−1) extends to the $\alpha$ direction and the street line $S\beta_j$ (j=1 to n−1) extends to the $\beta$ direction. In FIG. 5, signs are given to the chip areas placed in each corner, CA (1, 1), CA (1, n), CA (m, 1), CA (m, n), except other chip area (i, j). As shown in FIG. 5, the chip area CA (i, j) (i=2 to m−1, j=2 to n−1) are surrounded by the street lines $S\alpha_{i-1}$, $S\alpha_i$, $S\beta_{j-1}$, and $S\beta_j$. Furthermore, as shown in FIG. 6, the position detection mark MX (i, j) is formed on the street line $S\alpha_{i-1}$, which close to each chip area CA (i, j) XL0 distant from the left upper corner of the FIG. 6 in the $\alpha$ direction, according to each chip area CA (i, j). The detection mark MY (i, j) is formed on the street line $S\beta_{j-1}$ close to each chip area CA (i, j) YL0 distant from the left upper corner of the FIG. 6 in the −$\beta$ direction, according to each chip area CA (i, j).

Return to FIG. 4 again, the rough alignment is similarly conducted as described above for the wafer W loaded in step 203. On this condition, the main controller 20 is transmitted the detection results from the rough alignment sensors 40a, 40b, and 40c, the first approximation arrangement coordinate system ($\alpha'$, $\beta'$), which is coincide with the arrangement coordinate system ($\alpha$, $\beta$) on the wafer W in the accuracy within rough alignment, is calculated according to the results. The main controller 20 might rotationally drive the wafer holder 25 to coincide the X- and Y-direction with $\alpha'$- and $\beta'$-direction, respectively. In this case, the reference coordinate system (X, Y) coincides the first approximation arrangement coordinate system ($\alpha'$, $\beta'$). The description below is premising that the reference coordinate system (X, Y) coincides the first approximation arrangement coordinate system ($\alpha'$, $\beta'$).

In step 205, then, according to the first approximation arrangement coordinate system ($\alpha'$, $\beta'$), the main controller 20 drives the wafer W by moving the substrate table 18 so that the observation field of the alignment system AS include the border of the nearest street line to the notch N and the chip area CA. In order to minimize the error between the position obtained from the first approximation arrangement coordinate system ($\alpha'$, $\beta'$) and the true position, the target position for movement is in the observation field which includes the border between the nearest street line to the notch N and the chip area CA. In the case of the arrangement as shown in FIG. 5, the nearest street line to the notch N becomes street line $S\beta_{n/2}$ when n is an even number, and $S\beta_{(n-1)/2}$ or $S\beta_{(n+1)/2}$ when n is an odd number. As shown in FIG. 6, when the position detection mark MX (i, j) and MY (i, j) is formed, the border between the street line and chip area CA, which is the target position for the movement, is the border between the nearest street line $S\beta_{10}$ (one of the above-mentioned street line $S\beta_{n/2}$, $S\beta_{(n-1)/2}$, and $S\beta_{(n+1)/2}$) and the chip area CA (1, $J_0$+1). This derives from the following reasons: this border is closed to the notch N, and the wafer W is moved along the street line in the direction of the upper left corner in the chip area CA (i, j) to visit the detection position mark within the observation field as described below.

Figure 7A:
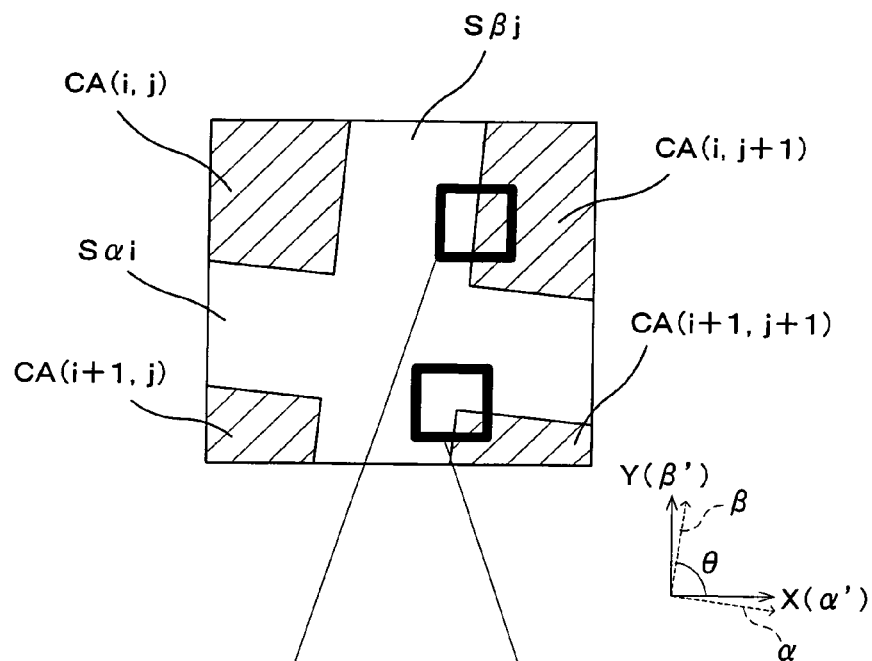
FIGS. 7A to 7C are views for explaining the image in the observation field.
Figure 7B:
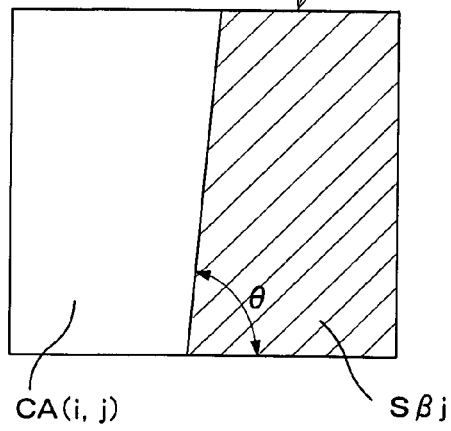
Figure 7C:
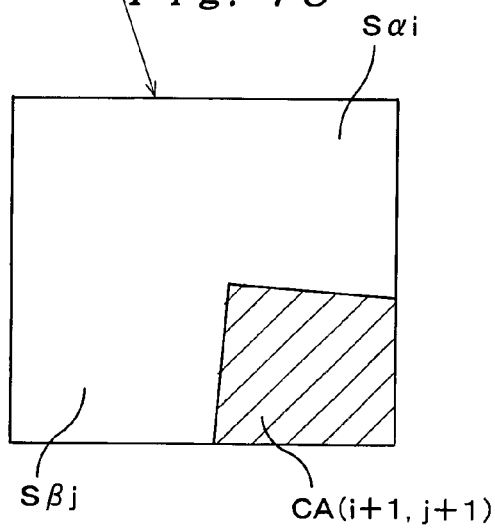

Return to FIG. 4, when the substrate is completed to move in step 205, the border between the street line $S\beta_{j0}$ and the chip area CA (1, $j_0$+1) is searched within the observation field of the alignment detection system AS in step 207. When the border is not detected, the border is searched, moving the wafer W around the position, and then the border is caught within the observation field. The border at that time and in below is detected by using the image processing in the main controller 20. Instead of the image processing in the main controller 20, the specific image processing apparatus may be used. The position of the observation field at the timing is referred to as "the initial position of the observation field". The range of the observation field is represented as a thick solid square in FIG. 7A, and it is smaller than those of the chip area CA or width of the street line $S\beta_i$ or $S\beta_j$ to detect the position detection mark MX (i, j) or MY (i, j) with high accuracy. Accordingly, the image shown in FIG. 7B or 7C is observed, when the chip area CA and the street line $S\alpha$ and $S\beta$ are in the observation field.

Back to FIG. 4, the main controller 20 chooses p in number of the position detection marks among the position detection marks MX (i, j) and MY (i, j) to decide the visiting order for the observation field. The position detection marks chosen are used to obtain the precise positional relation between the reference coordinate system (X, Y) and the arrangement coordinate system ($\alpha$, $\beta$). In below, the chosen position detection marks p in number are represented by using suffix in the visiting order, as the position detection mark $M_k$ (k=1 to p). The main controller 20 decides the moving route of the wafer W on which the observation field of the alignment system AS traces from the initial position of the observation field, when the AS sequentially visits the position detection mark $M_k$. The information for the moving route is referred to as the "moving route information RT". This moving route information RT is composed of, for example, two information: one is the information for the street line order on which the observation field traces when the field moves from the above described initial position or the position of the position detection mark $M_{k-1}$ to $M_k$ (referred to as the "order information $SQ_k$"), and the other is the mark information related to the position detection mark $M_k$ to be detected (referred to as the "mark information $MP_k$"). The mark information $M_k$ is further composed of the chip area information and identification information. The chip area information is corresponding to the position detection mark $M_k$ (the arranged position of the chip area CA (i, j), that is, (i, j); referred to as the "chip area information $CID_k$" hereinbelow). The identification information shows whether the mark detected is MX (i, j) or MY (i, j). Herein, the moving route information RT is represented as follows: by arranging the order information $SQ_k$ and the mark information $MP_k$ in sequential order of timing they used.

$RT=(SQ_1, MP_1, SQ_2, MP_2, \ldots, SQ_p, MP_p)$ $MP_k=(CID_k, MID)$ (k=1 to p)

Since the contents of the order information is the order of the street line on which the observation field should trace when the field moves from the initial position or the position detection mark $M_{k-1}$ to that of $M_k$, the designation of the contents are varied.

For example, the position detection mark MX (i, j) shown in FIG. 6 is set as the position detection mark $M_1$ to be visited firstly. Then, the observation field might trace the street line $\beta_{j0}$ from the initial position of the field, i.e., the position of the field which catches the border between the street line $S\beta_{j0}$ and the chip area CA (1, $j_0$+1). Then, the field trace the street line $S\beta_{j0}$ to reach the street line $S\alpha_{i-1}$. After that, the field might reach the corner of the chip area CA (i, j) (the left upper corner in FIG. 6 by tracing the street line $S\alpha_{i-1}$. Furthermore, by designating (i, j) to the chip area information $CID_1$ as the contents of the mark information $MP_1$, the movement of the observation field may be stopped at the corner of the chip area CA (i, j) (as shown in the left upper corner of FIG. 6. Alternatively, by designating MX mark (i, j) to the identification information $MID_1$, the observation field is moved onto the position detection mark MX (i, j) from the corner of the chip area CA (i, j).

Since the initial position of the observation field is known, designation of the street line $S\alpha_{i-1}$ is enough as the order information $SQ_1$ on which the field should trace from the initial position to that of the position detection mark $M_1$ for first visiting. Therefore, as the contents of the order information $SQ_1$, for example, the street line $S\alpha_{i-1}$ alone may be designated.

As the same manner that the order information $SQ_1$ is designated, the contents of the order information $SQ_k$ might be designated, when the field visits to the position detection mark $M_{k1}$ after visiting the mar $M_{k-1}$. The explanation will describe hereinbelow, premising the order information $SQ_k$ is set as described above.

The parameter k is set to 1 to show the position detection is conducted to detect the initial position detection mark $M_1$ in step 211.

Then, in step 213, the wafer W is moved to β' direction (i.e., Y-direction), which is presumed as β direction and is one of the arrangement direction of the chip area CA (i, j). At this time, the observation field traces the street line $S\beta_{j0}$ along −β direction. The image in the observation field of then is shown as those in FIGS. 7B and 7C, and these images move up and down in the both FIGS. During the movement, the main controller 20 incorporates the image information in the observation field through the alignment detection system AS at regular intervals, to detect the border position between the respective chip areas CA (i, $j_0$+1) and the street line $S\beta_{j0}$ in each time.

The reference coordinate system (X, Y) and the arrangement coordinate system (α, β) does not generally correspond each other. As shown in the FIGS. 7B and 7C, the angle between by X-axis and β-axis is θ. The moving velocity of the wafer W (i.e., the moving velocity of the substrate stage 18) is represented as $V_Y$, the moving velocity of the border in the observation field to X-direction $V_X$ is represented as follows.

$$V_X = V_Y \times \cot\theta$$

On the other hand, the reference coordinate system (X, Y) coincides with the arrangement coordinate system (α, β) in the accuracy obtained in the rough alignment. Therefore, θ may be not accurately 90°, but it shows that the value almost 90°. As a result, when the velocity $V_Y$ is too high to obtain the substantial static image, the movement of the border may be observed as the static image, because the moving velocity to X-direction of the border in the observation field, $V_X$ becomes small. In the observation image, for example, as shown in FIG. 7B, the image of the chip area CA (i, j) is obtained as that having average brightness of the images in the chip area CA (i, j); the image of the street line $S\beta_j$ is that having average brightness of the images in the street line $S\beta_j$. Accordingly, the turning points may be recognized as the border.

As mentioned above, the main controller 20 detects the border position between the chip area CA (i, $j_0$+1) and the street line $S\beta_{j0}$ at regular intervals, as well as calculate the change of the border position in the observation field. Then, according to the change of the border position obtained, the controller 20 detects the positional relation in the rotation direction between the reference coordinate system (X, Y) and the arrangement coordinate system (α, β), for example, the angle θ between the X-axis and β-axis. The main controller 20 corrects the first approximation arrangement coordinate system (α', β') based on the detection results. In the detection, longer the distance from the street line $S\beta_{j0}$ to the images in the observation field is used, higher the detection accuracy. Therefore, it is preferable that the arrangement position for the position detection mark $M_k$ is distant from the notch N in −β direction from a point of view for the detection accuracy.

In parallel with the above-mentioned detection, according to the change of the border position in the observation field, the main controller 20 decides whether the border between the chip area CA (i, $j_0$+1) and the street line $S\beta_{j0}$ can be continuously caught or not in the observation field in the moving direction of the wafer W at the time. When the main controller 20 decides that the border might be continuously caught in the observation field, the wafer W is subsequently continued to be moved as it is. On the contrary, the controller decides that the border can not be continuously caught in the observation field, according to the approximation arrangement coordinate system already corrected, the controller 20 amends the moving direction of the wafer W, or make the moving direction of the wafer W coincide with the corrected β'-axis direction.

Thus, the observation field gradually closes to the street line sa idly when it traces the street line $S\beta_{j0}$, catching the border between the chip area CA(i, $j_0$+1) and the street line $S\beta_{j0}$. When the main controller 20 recognizes this situation by using the positional information through the wafer interferometer 28, the controller 20 decreases the moving velocity of the wafer W for low speed movement. Subsequently, the cross point of the street line $S\beta_{j0}$ and the street line $S\alpha_{i-1}$ is searched. The main controller 20 terminates the movement of the wafer W for which the observation field can trace the street line $S\beta_{j0}$, when the crossing image formed by the street line $S\beta_{j0}$ and $S\alpha_{i-1}$, for example, shown in FIG. 7C, is caught in the observation field.

Then, the main controller 20 decides the positional relation between the street line $S\beta_{j0}$ and the position detection mark $M_1$ from the chip area information $CID_1$ of the mark information $MP_1$. The controller 20 recognizes the direction of the street line $S\alpha_{i-1}$ to be traced by the observation field. Then the wafer W is moved so that the observation field traces the border between the street line $S\alpha_{i-1}$ and the chip area CA (i, j) to the recognized direction. During this movement as the same that the observation field traces the street line $S\beta_{j0}$, the change of the border position is detected. Then, the approximation arrangement coordinate system already corrected is continuously corrected according to the detection result. Alternatively, according to the detection results, the moving direction of the wafer W is amended or rotated if necessary, so that the border between the street line $S\alpha_{i-1}$ and the chip area CA (i, j) is continuously caught by the observation field. When the observation field reaches the crossing point formed by the position detection mark $M_1$ and the nearest street line to the mark, i.e., that point is formed by the street lines $S\alpha_{i-1}$ and $S\beta_{j-1}$, the main controller 20 terminates the movement of the wafer W which is used for the observation field to trace the street line $S\alpha_{i-1}$.

Return to FIG. 4, in step 215, the wafer W is moved so that the position detection mark $M_1$ is caught by the observation field based on the approximation arrangement coordinate system already corrected with considering the identification information $MID_1$ of the mark information $MP_1$ together with the known distance XL0. Then, in step 217, the position of the position detection mark M, in the reference coordinate system (X, Y) is detected from the observation image obtained by the alignment detection system AS to be memorized in the main controller 20.

In step 219, it is decided whether the position detection for all of the position detection mark $M_k$ is conducted or not, i.e., k=p or not. In this step, the position detection for the position detection mark $M_1$ is only conducted, and then goes to next step 221. In step 221, the parameter k is incremented (k k+1). The parameter k is set to 2 to represent to visit the second position detection mark $M_2$ hereinafter.

In step 223, considering the condition of the approximation arrangement coordinate system corrected by using the detection for the change of the border position and its detection results up to that time, the main controller 20 decides whether the corrected approximation arrangement coordinate system corrected by the detection of the street line is corresponded to the true arrangement coordinate system (α, β) with enough accuracy. When it is decided that the approximation arrangement coordinate system has enough accuracy, the corrected approximate coordinate system is set as the second approximation coordinate (α", β"). After that, in the visiting by the observation field to the position detection mark $M_2$, the observation field moves the minimum distance up to the position of the position detection mark $M_k$ which is obtained according to the second approximation coordinate (α", β"). On the contrary, when it is decided that the corrected approximation arrangement coordinate system does not have enough accuracy, steps 213 to 221 are conducted as the same manner that the position detection mark $M_1$ is visited as mentioned above. That is, according to the order information $SQ_2$, the wafer W is moved so that the observation field takes the route, that is, the street line formed on the wafer. Then, the approximation arrangement coordinate system in corrected.

After that, in step 219, similarly to the above, the position detection of the position detection $M_k$ is conducted until it is decided that the all of the position detection mark $M_k$ are detected. When it is decided that the position detection for the all of the position detection mark $M_k$ is conducted in step 219, the main controller 20 performs statistical procedure in step 225, based on the memorized detection result of the position detection mark $M_k$. The statistical procedure is carried out by using the techniques disclosed, for example, Japan laid-open No. S61-44429 and its corresponding U.S. Pat. No. 4,780,617, Japan laid-open No. H02-54103 and its corresponding U.S. Pat. No. 4,962,318, and so forth. By using statistical processing, the positional relation between the reference coordinate system (X, Y) and the arrangement coordinate system (α, β) is detected with high accuracy to be conducted fine alignment. The disclosure described in the above is fully incorporated by reference herein, as far as the law of the countries designated in a request or elected in a demand for the application filed in the country of origin permits them.

The second layer is exposed as the same manner that for that of the first layer, according to the thus detected the positional relation with high accuracy between the reference coordinate system (X, Y) and the arrangement coordinate system (α, β). For exposure to the third and subsequent layers, they are exposed as the same manner that for the second layer. That is, the positional relation between the reference coordinate system (X, Y) and the arrangement coordinate system (α, β) is detected with high accuracy, and the position of chip area CA (i, j) is detected with high accuracy.

Therefore, in the above-mentioned embodiment, the position detection equals to the conventional search alignment, is conducted during the period that is not conventionally used for the measurement. In this period, the wafer W and the observation field of the alignment detection system are relatively moved to conduct the multi-layer exposure with good overlay accuracy. As a result, the search alignment step which was conventionally performed and essentially needed may be skipped. Therefore, the positional relation between the reference coordinate system (X, Y) and the arrangement coordinate system (α, β) might be detected in high speed, maintaining high accuracy. Thereby reducing the exposure step, i.e., exposure through put is enhanced. Furthermore, since the alignment detection system AS does not need two observation systems; one is the low magnifying power observation field for the search alignment, and the other is the high magnifying power one for fine alignment, the composition of the alignment detection system AS becomes simply.

Further, in the exposure apparatus 100 of the present embodiment, elements shown in FIG. 1 such as the above-mentioned illumination system 10, the rough alignment system RAS, the alignment system AS, and projection optical system PL are connected electrically, mechanically and optically to assemble the apparatus 100. After that, the apparatus 100 is totally adjusted (electrical adjustment or inspection of the operation) to produce the exposure apparatus 100. The production of the exposure apparatus 100 is preferably produced in a clean room in which temperature and cleanliness of the air are controlled.

An embodiment of a device manufacturing method by using the exposure apparatus and method above will be described.

Figure 8:
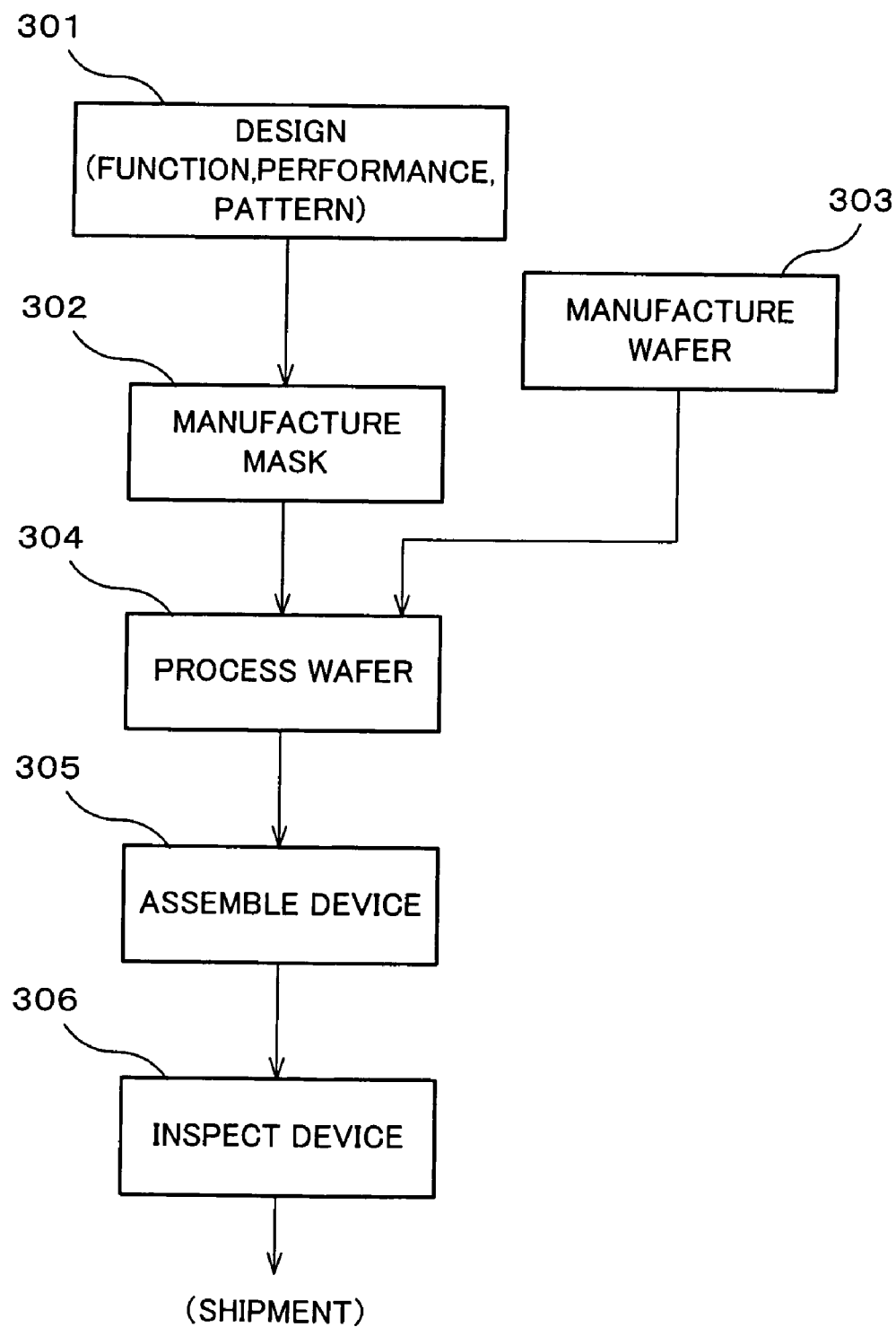
FIG. 8 is a flow chart for explaining the device manufacturing method by using the exposure apparatus shown in FIG. 1.

FIG. 8 is a flow chart showing an example of manufacturing a device (a semiconductor chip such as an IC, or LSI, a liquid crystal panel, a CCD, a thin film magnetic head, a micromachine, or the like). As shown in FIG. 8, in step 301 (design step), function/performance is designed for a device (e.g., circuit design for a semi conductor device) and a pattern to implement the function is designed. In step 302 (mask manufacturing step), a mask on which the designed circuit pattern is formed is manufactured. In step 303 (wafer manufacturing step), a wafer W is manufacturing by using a silicon material or the like.

In step 304 (wafer processing step), an actual circuit and the like are formed on the wafer W by lithography or the like using the mask and wafer prepared in steps 301 to 303, as will be described later. In step 305 (device assembly step), a device is assembled by using the wafer processed in step 304. Step 305 includes process such as dicing, bonding and packaging (chip encapsulation).

Finally, in step 306 (inspection step), a test on the operation of the device, durability test, and the like are performed. After these steps, the device is completed and shipped out.

Figure 9:
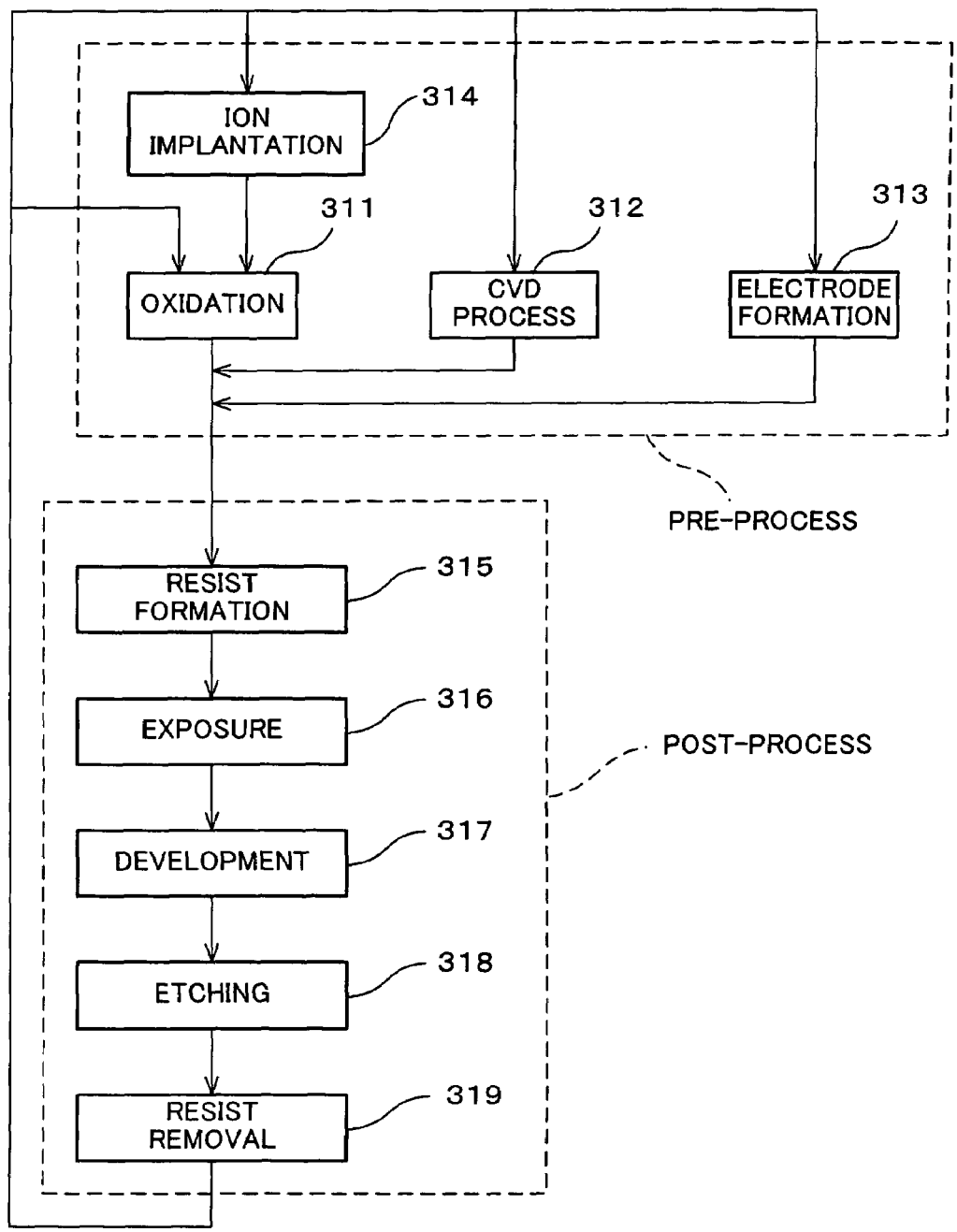
FIG. 9 is a flow chart showing the processing step in FIG. 8.

FIG. 9 is a flow chart showing a detailed example of step 304 described above in manufacturing the semiconductor device. Referring to FIG. 9, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 315 (resist formation step), the wafer is coated with a photosensitive agent. Next, as in step 316, the circuit pattern on the mask is transcribed onto the wafer by the above exposure apparatus and method. Then, in step 317 (developing step), the exposed wafer is developed. In step 318 (etching step), and exposed member on a portion other than a portion where the resist is left is removed by etching. Finally, in step 319 (resist removing step), the unnecessary resist after the etching is removed.

By repeatedly performing these pre-process and post-process, multiple circuit patterns are formed on the wafer.

In the above-mentioned embodiment, prior to fine alignment, rough alignment is conducted. However, when pre-alignment is conducted before the wafer W is loaded on the substrate table 18 and its accuracy is enough for the observation field to trace the border between the street line and the chip area, rough alignment step (step 203) may be skipped in the present embodiment; thereby rough alignment detection system RAS becoming unnecessary.

In the above-mentioned embodiment, two position detection marks are formed on each chip area, and chosen marks among them are used for position detection to perform EGA. However, the present invention may apply on so-called multiple point EGA in a shot, in which four position detection marks are formed on each chip area, and chosen marks among them are used for the actual position detection, disclosed in Japan laid-open No. H06-275496 and its corresponding U.S. patent application No. 183,879 (filing date: Jan. 21, 1994) and its CIP application No. 569,400 (filing date: Dec. 8, 1995). The disclosure described in the above is fully incorporated by reference herein, as far as the law of the countries designated in a request or elected in a demand for the application filed in the country of origin permits them.

Further, in the above-mentioned embodiment, it is explained the case in which the dioptric system is used as the projection optical system PL. However, catoptric system or cato-dioptric system may be used as the projection optical system. The projection optical system may be reducing system or magnifying system.

The present invention may apply on any type of the wafer exposure apparatus, for example, the reduced projection exposure apparatus of which light source is ultraviolet and soft X-ray with its wave length about 10 nm, X-ray exposure apparatus of which light source is X-ray with its wave length 1 nm, EB (electron beam) or ion beam exposure apparatus. Furthermore, the present invention may apply on both step-and-repeat machine and step-and-scan machine.

Also, the present invention may apply on step-and-stitching machine. In this machine, a plurality of the divided circuit patterns is patched on the substrate to transfer one large circuit pattern on it. When the divided circuit patterns are patched on the substrate, respective pattern is transferred to the substrate overlapping each overlapping area having predetermined width. Step-and-stitching machine includes the machine in which the divided patterns are transferred by step-and-repeat manner or by step-and-scan manner.

INDUSTRIAL APPLICABILITY

As described above, according to the position detecting method and the position detecting apparatus of the present invention, the equal position detection to the search alignment may be conducted during the period which is necessary for fine alignment and is not conventionally used, and in the period relative movement of the substrate and the observation field. Therefore, the conventional search alignment step may be skipped. Accordingly, the position detecting method and the position detecting apparatus of the present invention are preferable for the position detection of the divided areas which are formed on the substrate and divided by the street lines in high speed and in high accuracy.

Further, according to the exposure method and the exposure apparatus, the divided areas formed on the substrate are detected by the position detecting method of the present invention, and then high speed and highly precise position detection is conducted. After that, the divided areas are exposed, and the pattern formed on the mask is transferred onto the substrate. Accordingly, the exposure method and the exposure apparatus of the present invention are preferable to perform multilayer exposure, which is conducted to form multilayer patterns, holding the overlay accuracy between layers with enhanced through put. Accordingly, the exposure apparatus is preferable for mass-production of the devices having fine patterns.

What is claimed is:

1. A position detecting method for detecting positions of a plurality of divided areas divided by street lines on the substrate, by using an observation optical system, said position detecting method comprising:
   performing image pickup of a boundary between at least one said street lines and at least one of said divided areas on said substrate, while relatively moving said substrate and an observation field of said observation optical system in a direction perpendicular to an optical axis direction of the observation optical system;
   detecting a positional change of said boundary in a different direction from a direction of said relative movement, based on image information obtained in said image pickup during the relative movement; and
   detecting a positional relation between a reference coordinate system that defines a movement of said substrate, and an arrangement coordinate system that corresponds to an arrangement of said plurality of divided areas on the substrate, based on the detected positional change of said boundary.

2. The position detecting method according to claim 1, wherein
   in said performing image pickup, said image pickup of said boundary is performed at regular intervals during said relative movement.

3. The position detecting method according to claim 1, wherein
   said positional change of said boundary is detected in a direction substantially perpendicular to a direction of said relative movement in a two-dimensional plane including the direction of the relative movement.

4. The position detecting method according to claim 3, wherein
   the detection of said positional change of said boundary is performed during said relative movement.

5. The position detecting method according to claim 3, wherein
   said positional relation is detected, based on a positional change of said at least one of said street lines in a direction perpendicular to the direction of said relative movement while the relative movement is performed.

6. The position detecting method according to claim 5, wherein
   prior to the detection of said at least one of said street lines, an outer edge of said substrate is measured, and based on the measurement result, said positional relation between said reference coordinate system and said arrangement coordinate system is detected with predetermined accuracy lower than accuracy with which the positional relation is detected while the relative movement is performed.

7. The position detecting method according to claim 6, wherein
said substrate is rotated so that an axis direction of said reference coordinate system is parallel to an axis direction of said arrangement coordinate system, based on said positional relation detected with said predetermined accuracy.

8. The position detecting method according to claim 5, wherein
said observation field is relatively moved with respect to said substrate along said at least one of said street lines.

9. The position detecting method according to claim 8, wherein
in the detection of said at least one of said street lines, a positional change of a border between said at least one of said divided areas and said at least one of said street lines within said observation field is measured by observing a moving picture within said observation field while relatively moving said substrate and the observation field, and
said positional relation is detected based on the measurement result of the positional change of said border.

10. The position detecting method according to claim 9, wherein
when it is presumed that said border is out of range of said observation field, the relative movement of said substrate and said observation field is corrected so that the border is continuously caught within the observation field.

11. The position detecting method according to claim 9, wherein
in the detection of said at least one of said street lines, an image formed by a total quantity of light that reaches each point within said observation field is picked up during a predetermined pickup time, and
said positional change of said border within the observation field is measured based on the pickup result.

12. The position detecting method according to claim 1, wherein
said positional change of said boundary is detected by obtaining image information through picking up an image of said boundary.

13. The position detecting method according to claim 1, wherein
said relative movement of said substrate and said observation field is performed so that a predetermined number of position detection marks, which are chosen from a plurality of position detection marks formed on said at least one of said street lines, are caught within the observation field in predetermined order,
a position of the chosen predetermined number of position detection mark is detected, and
based on the detection result, said positional relation is detected with higher accuracy than accuracy with which the positional relation is detected while the relative movement is performed.

14. A position detecting apparatus that detects positions of a plurality of divided areas divided by street lines on a substrate, said position detecting apparatus comprising:
a substrate stage that holds said substrate;
an observation system that performs image pickup of said substrate by using an observation optical system;
a driving unit that drives said substrate stage in a direction perpendicular to an optical axis direction of said observation optical system; and
a processing unit that is electrically connected to the observation system, and obtains a positional relation between a reference coordinate system that defines a movement of the substrate stage, and an arrangement coordinate system that corresponds to an arrangement of said plurality of divided areas on the substrate, based on image information regarding a boundary between at least one of said street lines and at least one of said divided areas obtained by the observation system while the substrate stage is moved by said driving unit.

15. The position detecting apparatus according to claim 14, wherein
said observation system observes a positional change of said boundary in a direction substantially perpendicular to a moving direction of substrate stage during the movement of said substrate stage.

16. The position detecting apparatus according to claim 15, further comprising:
a control system that is electrically connected to said driving unit, and controls the driving unit so that said at least one of said street lines is detected by said observation system while moving said substrate stage, when detecting a mark on said substrate.

17. The position detecting apparatus according to claim 16, wherein
said control system controls said driving unit so that said observation field of said observation system follows a route to a predetermined position detection mark that is chosen from the position detection marks formed on said at least one of said street lines, and
the control system further detects a position of the chosen predetermined position detection mark and detects a position of each divided area based on the detection result of the chosen predetermined position detection mark.

18. The position detecting apparatus according to claim 17, wherein
said route is along a street line.

19. The position detecting apparatus according to claim 14, wherein
said observation system comprises an image pickup apparatus that obtains image information by performing image pickup of a substrate surface.

20. An exposure method in which a predetermined pattern is transferred to a divided area on a substrate by emitting an energy beam, said exposure method comprising:
detecting a position of said divided area formed on said substrate by using the position detecting method according to claim 1, prior to said transfer.

21. An exposure apparatus that transfers a predetermined pattern to a divided area on a substrate by emitting an energy beam, said exposure apparatus comprising:
an illumination system that emits said energy beam; and
the position detecting apparatus according to claim 14 that detects a position of said at least one of said divided areas.

22. A making method of a position detecting apparatus that detects a plurality of divided areas divided by street lines on a substrate, said method comprising:
providing a substrate stage that holds said substrate;

providing an observation system that performs image pickup of said substrate by using an observation optical system;

providing a driving unit that drives said substrate stage in a direction perpendicular to an optical axis direction of said observation optical system; and providing a processing unit that is electrically connected to the observation system, and obtains a positional relation between a reference coordinate system that defines a movement of the substrate stage, and an arrangement coordinate system that corresponds to an arrangement of said plurality of divided areas on the substrate, based on image information regarding a boundary between at least one of said street lines and at least one of said divided areas obtained by said observation system while the substrate stage is moved by said driving unit.

23. A device manufacturing method comprising a lithographic process, wherein a predetermined pattern is transferred onto a divided area divided by street lines on said substrate, by using the exposure method according to claim 20.

24. A device manufactured by using the device manufacturing method according to claim 23.

25. The position detecting method according to claim 1, wherein:

based on said detected positional relation between said reference coordinate system and said arrangement coordinate system, a direction of the relative movement is changed while relatively moving said substrate and said observation field.

* * * * *